Oct. 29, 1968
R. J. EHRET
PULSE COUNTER
3,408,577
Filed July 1, 1966
2 Sheets-Sheet 1

ROBERT J. EHRET
INVENTOR.
BY A. M. Fernandez
ATTORNEY

Oct. 29, 1968 R. J. EHRET 3,408,577

PULSE COUNTER

Filed July 1, 1966 2 Sheets-Sheet 2

ROBERT J. EHRET
INVENTOR.

BY A. M. Fernandez

ATTORNEY

United States Patent Office 3,408,577
Patented Oct. 29, 1968

3,408,577
PULSE COUNTER
Robert J. Ehret, Los Altos, Calif., assignor to Beckman Instruments, Inc., a corporation of California
Filed July 1, 1966, Ser. No. 562,179
3 Claims. (Cl. 328—43)

ABSTRACT OF THE DISCLOSURE

A ring counter consisting of a plurality of logic gates, a given one having its output terminal connected to input terminals of the two most remote gates for an odd number of stages and of the three most remote gates for an even number of stages in the ring and of an input switching gate having its input terminal connected to the input terminal of a logic gate adjacent the given one whereby only two or three input terminals are required for each logic gate depending upon whether the number of stages are odd or even.

This invention relates to a pulse counter, and more particularly to a counter of the cyclic type commonly referred to as a ring counter.

Ring counters have significant advantages over cascaded binary counters in many applications, particularly in those applications which require counting in a scale of ten, or some other number that is not a power of two. In a decimal counter employing four cascaded binary circuits, for instance, the radix of the counter is converted from 16 to 10 by either a complex gating matrix or a pair of feedback circuits. The gating matrix permits more rapid counting than the feedback circuits but is more costly both in terms of production costs and power consumption. Ring counters are less complex and are more simply adapted for counting in any scale. As an example, for the scale of ten, it is a simple matter to employ a binary circuit in cascade with a quinary ring counter.

Many ring counters devised in the past have been of the shift-register type which are not much less costly than cascaded binary counters, and sometimes more costly, as when binary circuits of the Eccles-Jordan type are employed in each stage. To achieve a savings in cost, ring counters of the gated type have been more recently devised using an active element, such as at least one transistor and suitable gating elements for each, to form a NOR or NAND gate, and a suitable interconnecting network between all stages.

Such gated ring counters devised in the past have been less complex than binary counters, or shift registers employed as ring counters, but have often required special complex interconnecting networks, or have required an interconnecting network that demands a gating circuit designed with a large fan-out specification sufficient for each gate to be connected to all other gates. It is desirable to maintain as low a fan-out as possible in order to minimize static power dissipation and the factor required for the transistors employed. It is also desirable to employ an input circuit which will change the counter from one state to another in a positive and rapid manner, and without increasing the number of input terminals.

An object of this invention is to provide a more simple gated ring counter than has been previously known. Another object is to provide an improved input circuit for a gated ring counter. Still another object is to provide an improved gated ring counter with a lower fan-out requirement for each stage than has been known heretofore.

According to a preferred embodiment of the present invention, a gated ring counter of any number $n$ of stages is provided comprising a first plurality of multiple input transistor NOR gates, each having its output terminal connected to an input terminal of the two (if $n$ is odd) or three (if $n$ is even) most remote stages of said first plurality of NOR gates, whereby the stable output signal produced by one less than a bare majority (if $n$ is odd) or one less than half (if $n$ is even) of those gates is distinct from the stable output signal produced by all other gates. An input circuit comprising a second plurality of two input NOR gates, one associated with each of said first plurality of NOR gates, causes the distinct output signal produced by those gates to progress in a predetermined direction through the first plurality of transistor NOR gates in response to successive pulses applied thereto over a common input line. That is accomplished by connecting one input terminal of each of the second plurality of NOR gates associated with the next preceding stage, and capacitively coupling the output terminal of each of the second plurality of NOR gates to the output terminal of its associated one of said first plurality of NOR gates. The common input line over which pulses to be counted are received is connected to the second input terminal of each of the second plurality of NOR gates.

Other objects and advantages will become more apparent from the following description in conjunction with the drawings in which—

Figure 3:
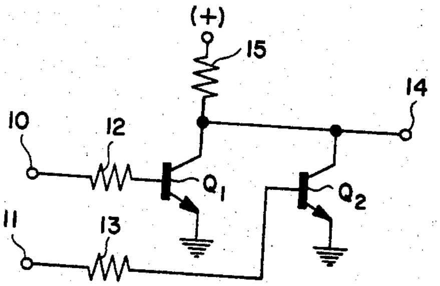
FIGURE 3 is a circuit diagram of a typical NOR gate employed in the first and second embodiments of the invention.

Although only one common type of NOR gate is illustrated in FIGURE 3, a type often referred to as a direct-coupled-transistor-logic (DCTL) gate, it should be understood that other NOR gate circuits may be employed such as the type commonly referred to as the resistor-transistor-logic (RTL) gate or the diode-transistor-logic (DTL) gate. There is still another type which, like the DTL gate, employs diodes; that type is commonly referred to as the low-level logic (LLL) gate. Still other types of NOR gates may be employed as well as all NAND gates such as the diode-transistor-logic (DTL) with diodes reversed (and bias polarity reversed on the diodes) or a transistor-transistor-logic (TTL) gate.

Referring now to FIGURE 3, a NOR gate is shown comprising a pair of NPN transistors $Q_1$ and $Q_2$ each having its emitter connected to circuit ground and its base connected to respective input terminals 10 and 11 by coupling resistors 12 and 13. When either input terminal 10 or 11 is positive with respect to circuit ground, its associated transistor is turned on, clamping the output terminal 14 to circuit ground through the low internal resistance of the transistor. Thus, if negative logic is employed a positive voltage signal is defined as binary 0. A "binary 0" signal at either input terminal, or both, will produce a zero volt signal at the output terminal 14 representing a binary 1. If a "binary 1" signal is applied to both input terminals, both transistors $Q_1$ and $Q_2$ will be cut off to produce a positive signal (binary 0) across a common collector resistor 15.

Figure 1:
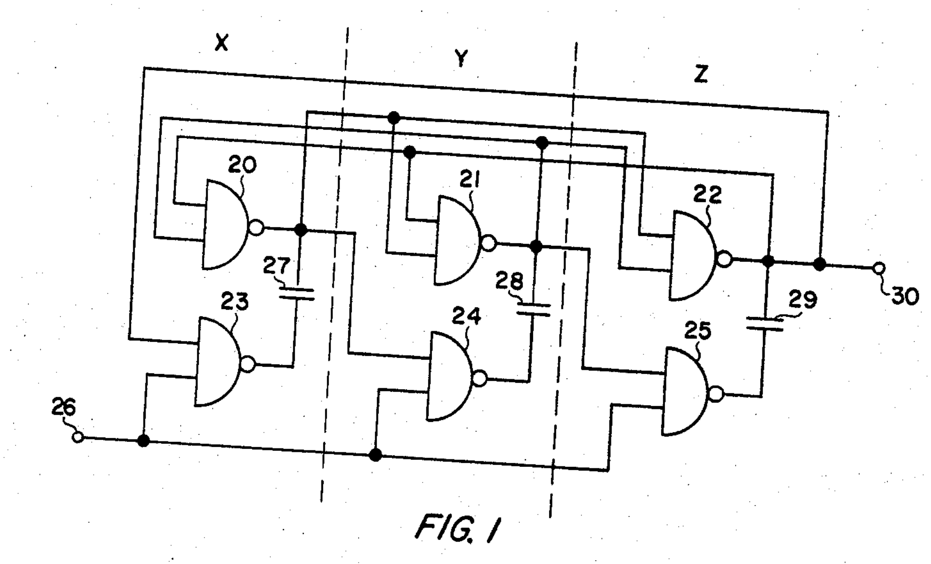
FIGURES 1 and 2 are logic diagrams of the first and second embodiments of the invention with an odd number of stages.

Referring now to FIGURE 1, a ternary counter is disclosed as a first embodiment of this invention. It comprises a plurality of two input transistor NOR gates 20, 21 and 22, the output terminal of each being connected to an input terminal of the other two to provide a circuit having three stable states. For instance, if the NOR gate 20 is cut off to transmit a positive signal, the remaining two NOR gates 21 and 22 will be turned on so that each will produce at its output terminal a zero volt signal, thereby establishing a zero volt (binary 1) input signal at each of the two input terminals of the NOR gate 20 to hold it cut off.

When power is first turned on, the transistors in all of the NOR gates will tend to conduct but as all will not conduct equally, two will reach saturation first and cut the third one off much in the same manner as one transistor in a binary circuit will reach saturation first to cut the other one off. Means may be provided to initially hold any one NOR gate off in order to establish an initial condition representing the ternary number zero.

A second plurality of two input transistor NOR gates 23, 24 and 25 is provided in order to cycle the ternary circuit through its three stable states representing the ternary numbers 0, 1 and 2 in response to successive pulses applied to an input terminal 26. The NOR gates 20, 21 and 22 are associated with the respective NOR gates 23, 24 and 25 to form stages X, Y and Z. Each of the NOR gates in the latter group has one input terminal directly connected to the output terminal of the first NOR gate in the preceding stage so that each will present at its output terminal the complement of the stable output signal of its preceding stage. Capacitors 27, 28 and 29 couple the output terminals of the NOR gates 20, 21 and 22.

To advance the counter from one state to the next, a positive input pulse is applied to the input terminal 26. Upon the rise of the input pulse, each of the three gates 23, 24 and 25 not already on will turn on and transmit a negative pulse to the associated ones of the first plurality of NOR gates 20, 21 and 22. For instance, assuming that the ternary circuit is in a state (011) having the NOR gate 20 cut off and the NOR gates 21 and 22 conducting, only the NOR gate 24 will be conducting prior to the input pulse. Upon the rise of the input pulse, only the NOR gates 23 and 25 are turned on to produce negative pulses across the coupling capacitors 27 and 29. However, only the negative pulse coupled by the capacitor 27 will have any effect on the ternary circuit since the output terminal of the NOR gate 22 is already at zero volts.

The negative pulse coupled across capacitor 27 will drive the output terminal of the NOR gate 20 toward zero volts thereby turning off the NOR gate 21 and tending to turn off the NOR gate 22. However, with the NOR gate 21 being turned off, a positive signal is transmitted from its output terminal to hold the NOR gate 22 on and drive the NOR gate 20 on. A second stable state (101) is thereby reached in which the NOR gates 20 and 22 transmit zero volt signals distinct from the positive signal transmitted by the NOR gate 21.

A second positive pulse received at the input terminal 26 produces a similar operation in which only the negative pulse coupled by the capacitor 28 to the output terminal of the NOR gate 21 is effective to turn the NOR gate 21 on and turn the NOR gate 22 off. The third input pulse which completes the cycle produces a negative pulse coupled by the capacitor 29 to the output terminal of the NOR gate 22 to turn the NOR gate 21 on and the NOR gate 22 off. An output signal may be taken from the output terminal at any stage, or stages, such as the output terminal 30 connected to the gate 22.

Figure 2:
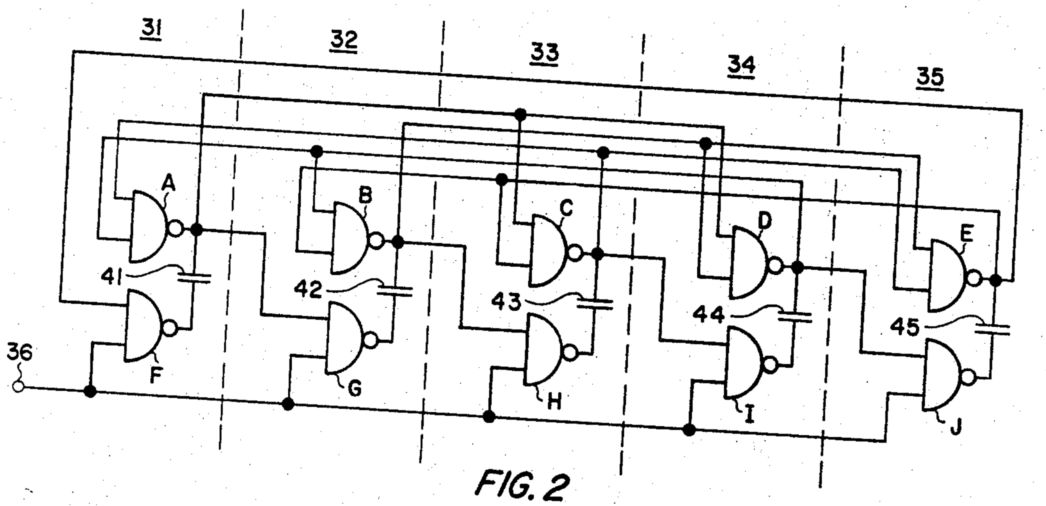

The second embodiment of the invention illustrated in FIGURE 2 is the same as the first embodiment described with reference to FIGURE 1 except that five stages are included to provide a quinary counter. It should be noted that in the embodiment of FIGURE 1 the output terminal of each stage is connected to an input terminal of the two most remote of the first plurality of NOR gates 20, 21 and 22 which are the remaining two NOR gates since there are only three stages, and also to an input terminal of the second NOR gate in the next succeeding stage. In this context, it will be understood that the phrase "most remote gates" as used herein contemplates the relative location of such gates in the counter as measured in a sequential manner from the input and output sides of the stage from which the output signal is being derived. In the embodiment of FIGURE 2, the first of the two most remote stages is not the succeeding stage but the one following. For instance, the output terminal of the stage 31 is connected to the NOR gate of the first plurality of NOR gates in stages 33 and 34 and to one of the second plurality of NOR gates in the next succeeding stage 32. Similarly, the output terminal of the stage 32 is connected to one of the first plurality of NOR gates in each of the most remote stages 34 and 35 and to one of the second plurality of NOR gates in the stage 33.

To facilitate describing the operation of the second embodiment illustrated in FIGURE 2, the first plurality of transistors are identified by the letters A, B, C, D and E while the second plurality of NOR gates are identified by the letters F, G, H, I, and J. The five stable states produced by the quinary circuit are shown in the following table.

| State | A | B | C | D | E | F | G | H | I | J |
|---|---|---|---|---|---|---|---|---|---|---|
| 1 | 1 | 1 | 1 | 0 | 0 | 1 | 0 | 0 | 0 | 1 |
| 2 | 0 | 1 | 1 | 1 | 0 | 1 | 1 | 0 | 0 | 0 |
| 3 | 0 | 0 | 1 | 1 | 1 | 0 | 1 | 1 | 0 | 0 |
| 4 | 1 | 0 | 0 | 1 | 1 | 0 | 0 | 1 | 1 | 0 |
| 5 | 1 | 1 | 0 | 0 | 1 | 0 | 0 | 0 | 1 | 1 |

Logic equations defining the functions of the gates for the five stable states shown in the foregoing table are as follows:

$$\overline{A}=CD$$
$$\overline{B}=DE$$
$$\overline{C}=EA$$
$$\overline{D}=AB$$
$$\overline{E}=BC$$

The logic of the system is negative such that a binary 1 is represented by a zero volt output signal and a binary 0 as a positive output signal just as in the ternary circuit of FIGURE 1. The various states are, of course, designated 1 through 5, arbitrarily selecting a given state as the state 1. By reversing the voltage levels for the binary values 1 and 0, such that a binary 1 is represented by a positive voltage signal and a binary 0 by zero volt, and reversing the polarity of the input pulse, NAND gates may be used with the same advantages. Similarly PNP transistors may be substituted for the NPN transistors by reversing the polarities of the biasing and operating potentials. In each case an important advantage achieved is that each gate A, B, C, D, and E drives only three gates, considering also the input switching gates F, G, H, I, and J, for a five stage ring counter and all gates require only two input terminals. The only other elements are the switching capacitors through which the switching gates advance the counter in a positive and rapid manner. Between input pulses, the state of the counter remains stable with a minimum of static power dissipation.

To advance the quinary counter to the next state, a positive pulse at input terminal 36 operates the five gates F, G, H, I, and J. By virtue of the connections from the output terminal of each stage to the one of the second plurality of gates in the next stage, such as the output terminal of stage 31 to the gate G, only one gate will have any effect and will advance the counter to the next stage. For example, if the counter is in the state 1, the output of the gates F and J will be equal to binary 1 (zero volts) and the output of the remaining gates will be equal to binary 0 (positive). When the positive input pulse is received at an input terminal 36, it will cause the output of all gates F, G, H, I, and J to be equal to binary 1 (zero volts) thereby applying a negative pulse to the output terminals of NOR gates B, C and D through respective coupling capacitors 42, 43 and 44. Since the output terminals of the NOR gates B and C are already equal to binary 1 (zero volts), it will have no effect on them. However, the output terminal of the NOR gate D equal to binary 0 (positive) in the first state will be driven to binary 1 (zero volts). When the output terminal of the NOR gate D falls to zero volts, the output terminal of the NOR gate A is driven to a binary 0 (positive voltage) which in turn is transmitted to the gate D to turn it on and thereby hold the output thereof at binary 1 (zero volts). The counter is then in state 2.

In the second state, the output terminals of the NOR gates A and E are positive while the output terminals of the NOR gates B, C and D are at zero volts. Consequently the output terminals of only the NOR gates F and G are at zero volts. When the second pusle is received at the input terminal 36, there is no change at the output terminal of those gates, but the output terminals of the remaining NOR gates H, I and J drop to zero volts, thereby transmitting over their respective coupling capacitors 43, 44 and 45 a negative pulse. As before, that negative pulse has no effect on the output terminals of the NOR gates C and D since they are already at zero volts but does have an effect on the output terminal of the NOR gate E. When the output terminal of the NOR gate E is driven to zero volts by the negative pulse transmitted over the coupling capacitor 45, base current into the gates B and C connected to the gate E is shunted. The second input terminal to the gate B is not receiving any base current at that time since it is connected to the output terminal of the gate D which is at zero volts. Accordingly the gate B is cut off and its output terminal switches to the binary 0 level (positive voltage). However, the second terminal of the gate C continues to receive base current from the gate A so that it continues to conduct and maintain its output terminal at the binary 1 level (zero volts). The positive voltage signal from the gate B provides base current into the gate E to turn it on and maintain its output terminal at the binary 1 level (zero volts). In that manner, the quinary circuit is advanced from the second state to the third. Since all stages are alike, the distinct stable output signal (binary 0) of two stages is caused to progress around the ring.

A third embodiment, not illustrated in the drawings, consists of seven stages with interconnections provided in a manner similar to that of the quinary counter of FIGURE 2, but with strict adherence to the rule that the output of each stage be connected to the most remote two stages. For example, the output of stage A is connected to input terminals of stages D and E in a septenary (seven-stage) counter having stages A through G. The control functions of all those gates is as follows:

$$\overline{A}=DE$$
$$\overline{B}=EF$$
$$\overline{C}=FG$$
$$\overline{D}=GA$$
$$\overline{E}=AB$$
$$\overline{F}=BC$$
$$\overline{G}=CD$$

The following table will facilitate understanding the operation of the septenary counter.

| State | A | B | C | D | E | F | G |
|---|---|---|---|---|---|---|---|
| 1 | 1 | 1 | 1 | 1 | 0 | 0 | 0 |
| 2 | 0 | 1 | 1 | 1 | 1 | 0 | 0 |
| 3 | 0 | 0 | 1 | 1 | 1 | 1 | 0 |
| 4 | 0 | 0 | 0 | 1 | 1 | 1 | 1 |
| 5 | 1 | 0 | 0 | 0 | 1 | 1 | 1 |
| 6 | 1 | 1 | 0 | 0 | 0 | 1 | 1 |
| 7 | 1 | 1 | 1 | 0 | 0 | 0 | 1 |

From that table it may be readily seen that the output of gate A, for example, is equal to binary 0 only when both input terminals thereof connected to the output terminals of stages D and E are equal to binary 1, which is only during states 3, 4 and 5. To further illustrate the manner in which any gated ring counter with an odd number of stages may be provided in accordance with the applicant's invention, consider the following control functions and table for a novenary counter.

| | State | A | B | C | D | E | F | G | H | I |
|---|---|---|---|---|---|---|---|---|---|---|
| $\overline{A}$=EF | 1 | 1 | 1 | 1 | 1 | 1 | 0 | 0 | 0 | 0 |
| $\overline{B}$=FG | 2 | 0 | 1 | 1 | 1 | 1 | 1 | 0 | 0 | 0 |
| $\overline{C}$=GH | 3 | 0 | 0 | 1 | 1 | 1 | 1 | 1 | 0 | 0 |
| $\overline{D}$=HI | 4 | 0 | 0 | 0 | 1 | 1 | 1 | 1 | 1 | 0 |
| $\overline{E}$=IA | 5 | 0 | 0 | 0 | 0 | 1 | 1 | 1 | 1 | 1 |
| $\overline{F}$=AB | 6 | 1 | 0 | 0 | 0 | 0 | 1 | 1 | 1 | 1 |
| $\overline{G}$=BC | 7 | 1 | 1 | 0 | 0 | 0 | 0 | 1 | 1 | 1 |
| $\overline{H}$=CD | 8 | 1 | 1 | 1 | 0 | 0 | 0 | 0 | 1 | 1 |
| $\overline{I}$=DE | 9 | 1 | 1 | 1 | 1 | 0 | 0 | 0 | 0 | 1 |

It should be noted that in a novenary counter, four stages (one less than a bare majority) have a binary 0 output signal in each state, and that such a distinct signal progresses around the counter one stage at a time as with the ternary, quinary and septenary counters. Undecimal, terdenary, quindenary, septen-decimal, novendary, etc., counters may be provided in the same manner without any change in the fan-out of each stage, and therefore without any change in the fan-in either. Such an advantage makes it economically feasible to manufacture the individual stages in large quantities to make up ring counters having any number of odd stages, although the quinary counter is the most important for the decimal number system.

A ring counter having an even number of stages, such as a quaternary, senary, octal and even decimal, can also be provided in accordance with the present invention with almost the same advantage as having an odd number of stages. The only difference in the general rule for a counter having an even number of stages is that, of the first plurality of NOR gates, each has its output terminal connected to an input terminal of the three most remote stages. For example in a quaternary counter, the output terminal of the first gate A is connected to the three most remote gates B, C and D. A better example is the senary counter in which the output terminal of the first gate A is connected to input terminals of the gates C, D and E.

The following control functions and table define a senary counter in accordance with the present invention.

| | State | A | B | C | D | E | F |
|---|---|---|---|---|---|---|---|
| $\overline{A}$=CDE | 1 | 1 | 1 | 1 | 1 | 0 | 0 |
| $\overline{B}$=DEF | 2 | 0 | 1 | 1 | 1 | 1 | 0 |
| $\overline{C}$=EFA | 3 | 0 | 0 | 1 | 1 | 1 | 1 |
| $\overline{D}$=FAB | 4 | 1 | 0 | 0 | 1 | 1 | 1 |
| $\overline{E}$=ABC | 5 | 1 | 1 | 0 | 0 | 1 | 1 |
| $\overline{F}$=BCD | 6 | 1 | 1 | 1 | 0 | 0 | 1 |

Figure 4:
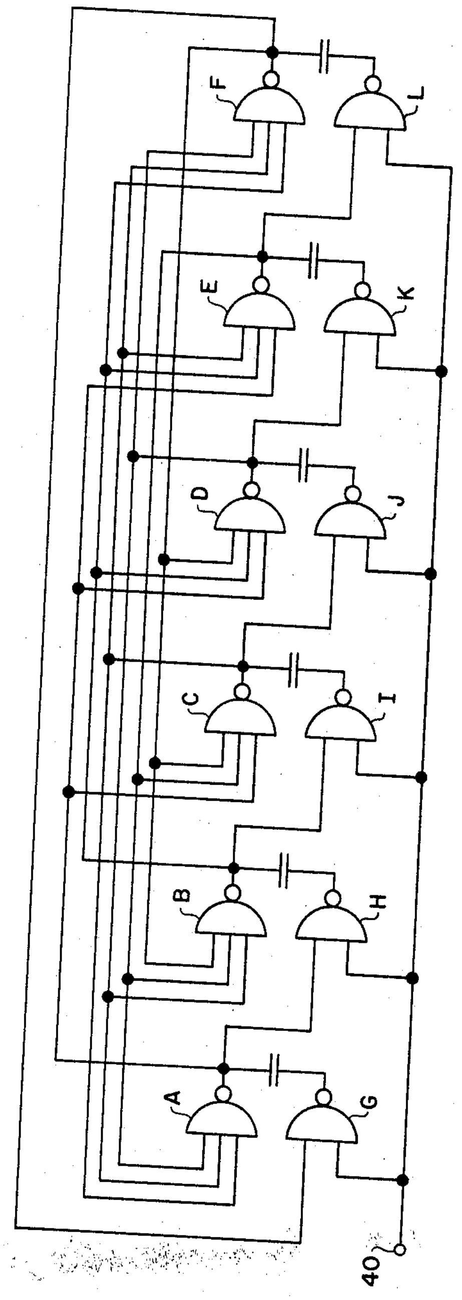
FIGURE 4 is a logic diagram of a third embodiment of the invention with an even number of stages.

The operation of such a senary counter illustrated in FIGURE 4 is the same as the embodiments previously described. Assuming the counter is in state 1, the output signals from gates A, B, C, D, E and F are binary 1, 1, 1, 1, 0 and 0, as shown in the immediately foregoing table. Letters of the alphabet are used for convenience, it being understood that they represent successive gates, the first one being arbitrarily selected and letter A and the sixth one F. The gates associated with the first plurality of gates A to F are then lettered G to L as shown.

The switching gates L and G are conducting in response to a binary 0 (positive) signal from gates E and F. Acordingly, when a positive input signal is received at input terminal 40, no pulse is transmitted by gates G and L. All other gates not conducting are driven into conduction by the positive input pulse, thereby transmitting negative pulses to the output terminals of the gates B, C, D and E over associated coupling capacitors, as in the embodiment illustrated in FIGURES 1 and 2. However, the output terminals B, C and D are already at substantially zero volts so the negative pulse will have no effect on output terminals of gates B, C and D. The output terminal of the gate E is driven toward zero volts to provide a binary 1 signal to the third input terminal of the gate A. With a binary 1 at all input terminals of the gate A, its output switches to a binary 0 (positive voltage). That binary signal is then transmitted from the gate A to the gate E to turn it on and provide at its output a binary 1 (zero volts) signal, thereby placing the counter in its second stable state.

The following control functions and table define an octal counter in accordance with the present invention.

| | State | A | B | C | D | E | F | G | H |
|---|---|---|---|---|---|---|---|---|---|
| $\bar{A}$=DEF | 1 | 1 | 1 | 1 | 1 | 1 | 0 | 0 | 0 |
| $\bar{B}$=EFG | 2 | 0 | 1 | 1 | 1 | 1 | 1 | 0 | 0 |
| $\bar{C}$=FGH | 3 | 0 | 0 | 1 | 1 | 1 | 1 | 1 | 0 |
| $\bar{D}$=GHA | 4 | 0 | 0 | 0 | 1 | 1 | 1 | 1 | 1 |
| $\bar{E}$=HAB | 5 | 1 | 0 | 0 | 0 | 1 | 1 | 1 | 1 |
| $\bar{F}$=ABC | 6 | 1 | 1 | 0 | 0 | 0 | 1 | 1 | 1 |
| $\bar{G}$=BCD | 7 | 1 | 1 | 1 | 0 | 0 | 0 | 1 | 1 |
| $\bar{H}$=CDE | 8 | 1 | 1 | 1 | 1 | 0 | 0 | 0 | 1 |

The operation of the octal counter in response to input signals is the same as for a senary counter, using the same switching network as described with reference to FIGURES 1, 2 and 3.

While the principles of the invention have now been made clear in illustrative embodiments, there will be immediately obvious to those skilled in the art other embodiments which are particularly adapted for specific environments and operating requirements without departing from those principles, such as the use of NAND gates for the NOR gates in the manner suggested hereinbefore. The appended claims are therefore intended to cover and embrace any such modifications, within the limits only of the true spirit and scope of the invention.

I claim:

1. In a ring counter having a number $n$ of stages, where $n$ is equal to or greater than five, and a plurality of distinct stable states equal to said number, the combination comprising a plurality of primary multiple-input gates, one for each of said stages, each gate including an inverter for producing the complement of the logical AND functions of multiple input signals, means for connecting the output terminal of each gate to an input terminal of the two most remote gates if $n$ is odd and to the three most remote gates if $n$ is even, whereby a distinct stable output is produced simultaneously by one less than a bare majority of said gates under static conditions if $n$ is odd, and by one less than a half of said gates under static conditions if $n$ is even, a counter input terminal adapted to receive input pulses to be counted, and switching means connected between said counter input terminal and said plurality of gates for progressively advancing said distinct stable output signal of one less than a bare majority of said gates in response to said input pulses to be counted from one stage to the next.

2. In a ring counter the combination as defined in claim 1 wherein said switching means comprises a plurality of secondary two-input gates, one associated with each of said plurality of primary gates, each secondary gate having an input terminal connected to the output terminal of the primary gate in the next preceding stage, a plurality of capacitors, one for each stage coupling the output terminal of the secondary gate to the primary gate associated therewith, and means for coupling said counter input terminal to the second input terminal of each of said secondary gates.

3. In a ring counter the combination as defined in claim 2 wherein each of said plurality of secondary gates includes an inverter for producing the complement of the logical AND function of its input signals, and the output terminal of each of said plurality of secondary gates is coupled by one of said plurality of capacitors to the output terminal of the primary gate associated therewith.

References Cited

UNITED STATES PATENTS

| | | | |
|---|---|---|---|
| 3,079,513 | 2/1963 | Yokelson | 307—223 |
| 3,110,821 | 11/1963 | Webb | 328—43 X |
| 3,210,569 | 10/1965 | Reek | 307—223 |

JOHN S. HEYMAN, *Primary Examiner.*